United States Patent [19]

Singhdeo et al.

[11] Patent Number: 4,687,540

[45] Date of Patent: Aug. 18, 1987

[54] METHOD OF MANUFACTURING GLASS CAPACITORS AND RESULTING PRODUCT

[75] Inventors: Narendra N. Singhdeo, New Haven; Michael J. Pryor, Woodbridge; Charles J. Leedecke, Northford; Norman G. Masse, Wallingford, all of Conn.

[73] Assignee: Olin Corporation, New Haven, Conn.

[21] Appl. No.: 888,615

[22] Filed: Jul. 23, 1986

Related U.S. Application Data

[63] Continuation-in-part of Ser. No. 811,846, Dec. 20, 1985.

[51] Int. Cl.$^4$ .................. C03B 29/00; B32B 17/06; C03C 15/00
[52] U.S. Cl. ...................................... 156/630; 65/32; 65/59.23; 65/59.4; 65/60.4; 65/157; 156/632; 156/667; 501/26; 501/72; 428/433; 428/632
[58] Field of Search ............... 156/630, 632, 666, 667; 65/59.3, 59.4, 59.23, 60.4, 149, 32, 148, 154, 157, 185; 501/26, 72; 428/433, 632

[56] References Cited

U.S. PATENT DOCUMENTS

| | | | |
|---|---|---|---|
| 1,809,863 | 6/1931 | Paxton | 65/157 |
| 2,233,622 | 3/1941 | Lytle | 65/32 |
| 2,873,556 | 2/1959 | Hainke | 65/32 |
| 3,200,298 | 8/1965 | Garibotti | 317/101 |
| 3,723,176 | 3/1973 | Theobald et al. | 264/61 X |
| 3,968,193 | 7/1976 | Langston et al. | 65/60.4 X |
| 4,024,309 | 5/1977 | Pender | 65/32 X |
| 4,215,020 | 7/1980 | Wahlers et al. | 501/17 X |
| 4,299,873 | 11/1981 | Ogahara et al. | 428/137 |
| 4,301,324 | 11/1981 | Kumar et al. | 174/68.5 |
| 4,313,026 | 1/1982 | Yamada et al. | 174/68.5 |
| 4,385,202 | 5/1983 | Spinelli et al. | 174/68.5 |
| 4,491,622 | 1/1985 | Butt | 428/632 |

FOREIGN PATENT DOCUMENTS

| | | | |
|---|---|---|---|
| 1404569 | 5/1964 | France | 65/32 |
| 1232621 | 5/1971 | United Kingdom . | |
| 1349671 | 5/1974 | United Kingdom . | |

OTHER PUBLICATIONS

"The Direct Bonding of Metals to Ceramics by the Gas-Metal Eutetic Method", by Burgess et al., *J. Electrochemical Society: Solid-State Science and Technology*, May 1975.

"Packaging", by Jerry Lyman, *Electronics*, vol. 54, No. 26, Dec. 29, 1981.

"Glass Microwave Capacitors", by R. S. Dencko and J. K. Womack, Proceedings of the 35th Electronic Components Conference, May 20-22 (1985), Washington, D.C., pp. 287-289.

"Glass: Science and Technology", vol. 2, Processing 1, edited by D. R. Uhlmann and published in *Academic Press, Inc.*, 1984.

*Primary Examiner*—Robert L. Lindsay
*Attorney, Agent, or Firm*—Paul Weinstein

[57] ABSTRACT

This invention relates to a laminated glass capacitor and method of making the capacitor. The capacitor is constructed of a plurality of internal electrodes stacked and having glass layers therebetween to give electrostatic capacity. External electrodes are connected to associated internal electrodes for taking out the electrostatic capacity. The glass layers are selected from a substantially pore free glass and the internal electrodes are formed of a metal foil selected from the group consisting of deoxidized copper alloy and oxygen free copper alloy.

16 Claims, 8 Drawing Figures

METHOD OF MANUFACTURING GLASS CAPACITORS AND RESULTING PRODUCT

This application is a continuation-in-part of U.S. patent application Ser. No. 811,846 entitled "Metal-Glass Laminate" by Charles J. Leedecke et al., filed Dec. 20, 1985.

This application is related to U.S. patent application Ser. No. 413,046 entitled "Multi-Layer Circuitry" by Sheldon H. Butt, filed Aug. 30, 1982; U.S. patent application Ser. No. 651,984, entitled "Sealing Glass Composite" by Edward F. Smith, III, filed Sept. 19, 1984 now abandoned; U.S. patent application Ser. No. 651,987, entitled "Sealing Glass Composite" by Edward F. Smith, III et al., filed Sept. 19, 1984; now abandoned; U.S. patent application Ser. No. 707,636, entitled "Pin Grid Arrays" by Michael J. Pryor, filed Mar. 4, 1985 (now abandoned); U.S. patent application Ser. No. 811,908, entitled "Steel Substrate with Bonded Foil" by Richard A. Eppler, filed Dec. 20, 1985; U.S. patent application Ser. No. 811,905, entitled "Hybrid and Multi-Layer Circuitry" by Michael J. Pryor et al., filed Dec. 20, 1985; U.S. patent application Ser. No. 811,911, entitled "A Hermetically Sealed Package" by Michael J. Pryor et al, filed Dec. 20, 1985; U.S. patent application Ser. No. 811,910, entitled "A Method of Joining Metallic Components" by Michael J. Pryor et al., filed Dec. 20, 1985; U.S. patent application Ser. No. 811,907, entitled "Hybrid and Multi-Layer Circuitry" by Michael J. Pryor et al., filed Dec. 20, 1985; U.S. patent application Ser. No. 811,906, entitled "Multi-Layer and Pin Grid Arrays" by Michael J. Pryor, filed Dec. 20, 1985; and U.S. Pat. No. 4,491,622, entitled "Composites of Glass-Ceramic to Metal Seals and Method of Making the Same" by Sheldon H. Butt, issued Jan. 1, 1985.

While the invention is subject to a wide range of applications, it is particularly useful for capacitor, hybrid circuitry and multi-layer applications and will be particularly described in that connection. More specifically, the invention is directed to laminating an oxygen-free or deoxidized copper foil to a bonding glass, and if desired, laminating a plurality of layers of foil and bonding glass to form a capacitor.

As the density of integrated circuit (IC) devices, also known as chips, has continued to increase, the chips are often mounted on hybrid circuitry. Despite continued advances in IC design and capability, the hybrid circuitry technology has remained substantially static.

Examples of hybrid circuitry design are described in a number of patents including U.S. Pat. Nos. 3,200,298; 3,723,176; 4,299,873 and 4,313,026. The hybrid substrate is typically a thin and relatively small piece of ceramic material, such as $Al_2O_3$, mixed with an organic binder and formed into a green sheet or substrate. Size is typically limited to a square of about four square inches. Conductive circuitry on the hybrid substrate may be formed by first silk screening a paste of gold, glass and a binder in any desired pattern onto a surface of the green ceramic substrate. The resulting assembly is fired at about 850° C. to first drive off the binder from the paste and then to sinter the glass and the gold. The fired glass-gold conductor has only about 60% of the electrical conductivity of bulk gold.

The conductor technology, using thick film pastes, also suffer from lot to lot variations of the pastes themselves. The cost associated with this thick film technology has inhibited its use where viable alternatives are available. However, the requirement for increasing the density of IC devices has forced its increased use despite all of the disadvantages enumerated herein.

An alternative process involves thin film technology where conductors are vacuum evaporated or sputtered onto 99% alumina substrates. These techniques are very expensive because of the very slow deposition rates of the conductors and because of the very high price of the 99% alumina substrate material.

To overcome the requirement for expensive gold conductors, there have been ongoing attempts to replace the gold paste with copper foil. One advantage to this substitution would be the ability to form more precise circuitry using dry film photoresist and conventional printed circuit board etching techniques. Dry film photoresist and conventional printed circuit etching are excellent techniques to produce accurate, reproducible and comparatively fine line circuitry on a copper layer bonded to a ceramic substrate. For example, 3 mil line widths on 3 mil spacings are relatively easy to generate using the above mentioned techniques. By contrast, the results from silk screened gold pastes is typically a 10 mil line width and somewhat more than 10 mil spacing. Also, cost comparisions are enormously favorable with forming circuitry in a copper layer.

Up until now, attempts to bond copper foil to alumina with glass under reducing conditions have invariably resulted in extensive blistering of the foil. This is due in part to the common use of CDA 11000 foil which contains cuprous oxide as a separate phase. When fired in a reducing atmosphere, the cuprous oxide in the alloy CDA 11000 is reduced and steam blistering results. It is also thought that blistering partially results from air entrapment in the glass due to the lack of a significant avenue of escape during the firing cycle. Blistering is particularly detrimental for multi-layer and hybrid circuitry because it creates a weak bond between the ceramic substrate and the copper foil which can lead to delamination. Also, during the etching process, the etching solutions can seep into a blister, at the glass to foil interface, and etch the foil at an undesirable location.

In an attempt to eliminate the problem of blistering, bonding under oxidizing conditions has been attempted as disclosed in a paper entitled "The Direct Bonding of Metals to Ceramics by the Gas-Metal Eutectic Method" by Burgess et al., published in *J. Electrochemical Society: SOLID-STATE SCIENCE AND TECHNOLOGY*, May, 1975. This technique has attempted to take advantage of the high temperature cuprous oxide formed on the foil. Although this approach produced good bonds without blistering, it formed a high temperature cuprous oxide film on the outer surface of the foil; this film is extremely difficult to remove.

The present invention also relates to multi-layer circuitry of which pin grid arrays or side brazed packages are typical examples. Pin grid arrays are typically small, multi-layer 96% alumina boards with conductive circuitry between the layers. The pin grid array minimizes the size required for large integrated circuits and permits the use of higher pin counts than possible with conventional quad packs. Side brazed packages are similar in construction to pin grid arrays except that electrical contact to the electrical circuitry is with pins brazed onto the side of the package. Both of these package designs provide rugged, reliable, hermetic packages and are preferable to CERDIPs because they are not dependent on glass encapsulation of the leads.

Conventional pin grid arrays typically contain at least three layers of alumina made by the tape cast process. The interlayer circuitry is fabricated with tungsten or moly-manganese powder silk screened onto a green alumina tape (96% $Al_2O_3$). The interconnects between the interlayer circuitry are provided through approximately about 5-10 mil holes punched in the green alumina tape. The interconnect or through-hole conductors are also formed with tungsten or moly-manganese powder. The multi-layer alumina tapes and conductor paths are cofired in the region of about 1550°-1600° C. This expells the polymeric binder from the alumina tape, sinters the 96% $Al_2O_3$ and produces partial sintering of the current carriers. The exposed conductors may then be coated with nickel by an electroless process. Thereafter, gold plated lead pins are brazed to the through-hole conductors.

There are a number of costly, technical problems in manufacturing pin grid arrays using the foregoing technology. The most serious technical problem is the very large volume contraction of the alumina tape when it is fired at high temperatures. The volume contraction can be as much as 60% and results in a lineal contraction of almost 20%. This causes severe problems in the location of the through-holes relative to the pins and also in maintaining through-hole electrical contact. In some cases, the contraction is so high that the conductive transverse circuitry misses the pin altogether. The conventional means of silk screening the interlayer circuitry on the alumina tape results in circuitry which is relatively dense and well sintered. However, the through-hole contact, which may be inserted mechanically, can be very loose and provide only low frequency particle to particle contact.

In the past, glass-ceramic structures with circuit patterns embedded therein were disclosed in U.S. Pat. No. 4,385,202 to Spinelli et al.; U.S. Pat. No. 4,301,324 to Kumar et al.; U.S. Pat. No. 4,313,026 to Yamada et al.; British Pat. Nos. 1,232,621 and 1,349,671. Each of these patents specifically differs from the present invention in that it fails to teach or suggest the bonding of a deoxidized or oxygen free copper or copper alloy foil to a relatively pore-free, high temperature glass.

Multi-layered alumina circuit boards, whose layers are formed with the process of the present invention, are particularly useful as pin-grid arrays of the general type disclosed in the article Entitled "Packaging" by Jerry Lyman, *Electronics,* Vol. 54, No. 26, Dec. 29, 1981.

Presently, microwave capable capacitors are experiencing increasing useage in high frequency circuitry where loss and inductance are of concern. To minimize loss and inductance, typical microwave capacitors utilize a high quality vitreous enamel, porcelain or ceramic dielectric with screened noble metal electrodes. However, glass is becoming an important option for high frequency capacitors. Until recently, glass was not usually considered because of its low dielectric constant (K) resulting in an inability to produce volumetrically, efficient capacitors. In a large number of microwave capacitor applications, small capacitance values resulting from high operating frequencies are encountered. Therefore glass is an excellent alternative because of the low capacitance and loss requirement of the dielectric and the typical K value being in the range of about 15 to about 150.

The dielectric of the capacitor determines most of the capacitor's characteristics. Among these characteristics are temperature coefficient (TC), temperature voltage coefficient(TVC), ageing rate and dissipation factor(DF). In addition, the dielectric directly affects the capacitors size—sometimes referred to as the capacitance/volume (C/V) ratio. The C/V ratio of a capacitor is determined by the material parameter of the dielectric termed the dielectric constant(K). Dielectrics are used in capacitors to increase the capacitance between electrodes. The magnitude in which the capacitance increases is called the dielectric constant of the dielectric. Hence, the choice of the dielectric has a profound impact on the C/V of a capacitor. In microwave capacitors, a tradeoff has been made between physical size and electrical performance which has resulted in the common use of relatively low K-factor dielectrics, i.e., around 20 for high quality capacitors. Glass dielectrics have a K-factor of about 10 and compare favorably to the highest quality microwave capacitors.

The temperature coefficient (TC) of a capacitor is a measure of the amount that its capacitance varies with temperature. Although the TC of glass is higher than that of traditional dielectric types, it has the inherent advantage of retraceability. That is, the TC of glass will retrace to the defined TC curve regardless of temperature excursion, direction or rate of change. In other words, glass dielectrics exhibit zero hystersis about the TC curve, whereas ceramic porcelain, and vitreous enamel dielectrics exhibit erratic retraceability patterns. This is an important factor when the capacitor is expected to experience multiple temperature excursions. Other advantages of glass dielectrics include low Q-factor roll-off rate, zero ageing rate and no TC hystersis. The previous discussion on glass dielectrics is more fully developed in the article entitled Glass Microwave Capacitors by R. S. Dencko and J. K. Womack, Proceedings of the 35th Electronic Components Conference, May 20-22 (1985), Washington D.C., pp. 287-289. The article also discloses a manufacturing technique including isostatic pressing of a glass plate between two silver foil electrodes. The process is quite expensive although these capacitors can find applications in a special field where such costs can be tolerated and where the unique properties of glass compactors provide an advantage over other types of capacitors.

Capacitors are built by incorporating a dielectric layer between two or more conducting metal plates. Capacitance of the capacitor is defined by the equation, $C = K'_o A/t$, where C is the capacitance, $K'$ is the dielectric constant, $o$ = permitivity of free space, A is the cross sectional area of the capacitor and t is the thickness of the dielectric contained between the conducting plates. An increase in capacitance can be obtained by either/or increasing the dielectric constant, increasing the conductor area, and decreasing the thickness of the dielectric. During the manufacturing process, ionic contamination has to be kept at a very low level to keep the dielectric constant high. Intimate physical contact between the conducting plates and the dielectric material is important because voids at the dielectric/conductor interface reduce the effective area and the capacitance of the capacitors.

It is a problem underlying the present invention to form a glass to metal laminate suitable for hybrid or multi-layer circuit board assemblies capable of high temperature stability, as well as capacitors, wherein one or more layers of copper alloy foil are bonded to one or more layers of glass without forming blisters or bubbles at the interface between the foil layer or layers and the bonding glass. Another problem addressed by the present invention is the production of relatively low cost glass capacitors.

It is an advantage of the present invention to provide a process of forming and the article of glass to metal laminates which obviate one or more of the limitations and disadvantages of the described prior processes and arrangements.

It is a further advantage of the present invention to provide a process of forming and the article of glass to metal laminates with deoxidized or oxygen free copper alloy foil bonded to a relatively pore-free bonding glass.

It is a still further advantage of the present invention to provide a process of forming the capacitor resulting from bonding layers of deoxidized or oxygen free copper alloy foil with relatively pore-free bonding glass.

Accordingly, there has been provided a process of forming and the resulting glass to metal laminate. The steps include providing a glass and a metal foil of either deoxidized copper alloy of oxygen-free copper alloy. The glass is heated to a temperature of between about 600° to about 1025° C. with a viscosity between about $10^3$ to about $10^8$ poise. Then is is pressed against the foil and cooled to chemically bond it to the foil and form a laminate of metal foil and a substantially pore-free glass. In a second embodiment, a capacitor incorporating the glass to metal laminate is disclosed.

BRIEF DESCRIPTION OF THE DRAWINGS

The invention and further developments of the invention are now elucidated by means of the preferred embodiments of the drawings.

Figure 1:
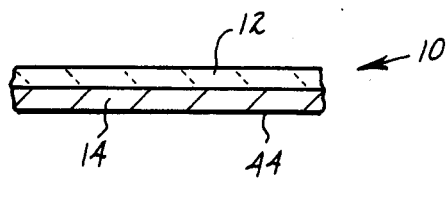
FIG. 1 illustrates a copper alloy foil bonded to a layer of essentially pore-free glass.
Figure 2:
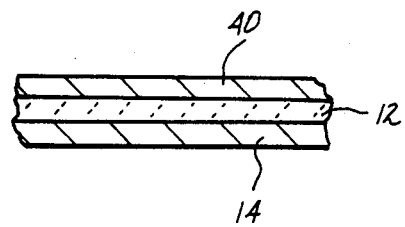
FIG. 2 illustrates a side cross-sectional view of two layers of copper alloy foil bonded to a layer of essentially pore-free glass layer disposed therebetween.

The present invention is directed to a metal-glass laminate 10. A glass 12 is provided along with a first metal foil 14 selected from the group consisting of deoxidized copper alloy and oxygen free copper alloy. The glass is heated, pressed against the foil and cooled whereby it is chemically bonded to the first metal foil to form a laminate of a layer of metal foil and a layer of relatively pore-free glass.

The glass 12 may be selected from any composition having a viscosity of about $10^3$ to about $10^8$ poise in the temperature range of about 600° C. to about 1025° C. The glass must be able to be chemically bonded to deoxidized copper alloy and oxygen free copper alloy. Preferably, the glass is selected from the group consisting of silicate, borosilicate, borate and phosphate glasses. The silicates preferably have a general composition of BaO-ZnO-SiO$_2$. The borosilicates preferably have a general composition of B$_2$O$_3$-SiO$_2$-MO where MO equals Al$_2$O$_3$, MgO, CaO, BaO, K$_2$O, Na$_2$O, ZnO, SrO, ZrO$_2$ and mixtures thereof.

The glass has a coefficient of thermal expansion (CTE) of between about $50\times10^{-7}$ to about $160\times10^{-7}$ in/in/°C. The CTE is selected to match the CTE of the dominant component of the system. For example, if the substrate is a ceramic, the CTE might be about $50\times10^{-7}$ to about $105\times10^{-7}$ in/in/°C. On the other hand, if the copper strip is the main component, the CTE might be about $140\times10^{-7}$ to about $160\times10^{-7}$ in/in/°C.

The object of the present invention is to form a glass-metal laminate where the glass is substantially pore-free. This structure is particularly useful for applications in the electronic industry where the copper alloy is subjected to a strong etching solution to dissolve portions of the copper layer and form circuit patterns. The pore-free glass has been found to be extremely resistive to attack and dissolution by the etching solution. Therefore, the circuitry formed in foil bonded to substantially pore-free glass is more precise and can be subjected to greater tolerance restrictions.

The glass layer is preferably bonded to the layer of foil in one of two ways. First, the glass having a viscosity of about $10^3$ to about $10^8$ poise and preferably between about $10^4$ to about $10^6$ poise may be coated directly onto the foil by any number of techniques as more fully elaborated on herein. Also, the glass may be formed into a solid glass preform. Then the glass can be disposed against the one layer of foil or alternatively between two or more layers of foil. The stacked layers are then heated to a temperature of about 600° to about 1025° C. where the glass has a viscosity of about $10^3$ to about $10^8$ and preferably between about $10^4$ to about $10^6$ at a temperature between about 800° to about 1000° C. The glass and foil are than pressed together at a pressure of less than about 350 gr/sq. in. and preferably between about 100 to about 200 gr/sq. in. The resulting glass-metal laminate is cooled in any conventional manner so that the glass chemically bonds to the foil. The resulting laminate can be cut to any desired size.

The glass composition is preferably selected to be free of lead oxide since lead oxide will partially reduce when heated in a reducing atmosphere. Lead in the glass may develop short circuits between adjacent layers of foil after etching. It is also desirable that the glass be essentially free of bismuth oxide since the latter may also partially reduce and develop short circuits in a manner similar to lead as described above.

There are two important considerations in the bonding process to prevent blistering of the foil. Firstly, the foil is preferably selected from an oxygen free or a deoxidized copper or copper alloy. Secondly, the bonding preferably occurs under reducing or inert conditions. For example, the copper foil is bonded to the glass in an atmosphere of inert or reducing gas such as for example, nitrogen, nitrogen 4% hydrogen or argon. The use of deoxidized or oxygen free copper foil prevents blistering within the foil when it is bonded under the reducing conditions.

Figure 3:
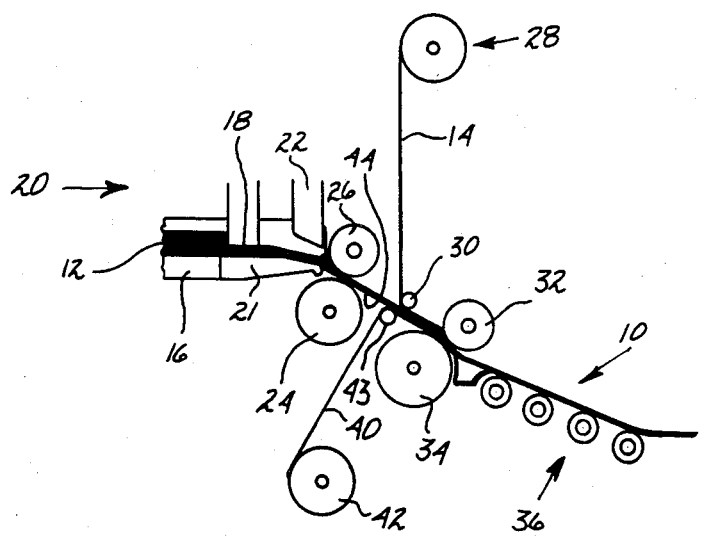
FIG. 3 illustrates a process for forming a layer of essentially pore-free glass between two layers of copper foil in accordance with the present invention.

The glass may be bonded to a strip of copper foil using a modified Pilkington process as illustrated in FIG. 3. This and other processes which are suitable to form the copper glass laminates are as described in the article entitled "Glass: Science and Technology", Volume 2, Processing 1, edited by D. R. Uhlmann and published in *Academic Press, Inc.*, 1984.

Referring to FIG. 3, the glass 12 is within a container 16 at a viscosity of about $10^3$ to about $10^8$ poise at a temperature range of about 600° to about 1025°. Preferably the glass has a viscosity between about $10^4$ to about $10^6$ poise at a temperature range of about 800° to about 1000° C. The glass flows under a flow controller 18 which can be moved up and down in a controlled manner to regulate the supply of glass in the pool upstream of rollers 34 and 26 in the forehearth 21. The glass flows across the forehearth in the direction of arrow 20 under a heat shield 22 which reduces the transmission of heat from the hearth to the cooling rolls 24. Next, rolls 24 and 26 rotate, contact the molten glass and pull the molten glass into the pass, from which it emerges as a ribbon of thickness determined by the serparation between the rolls. These rolls are preferably water cooled and extract enough heat so that the viscosity of the ribbon emerging from the rolls is high enough to avoid narrowing from surface tension forces at the edges. This viscosity is preferably about $10^3$ to about $10^8$ poise and more preferably between about $10^4$ to about $10^6$ poise at a temperature between about 800° to about 1000° C. A layer of foil 14 is continuously fed from a roll 28, across a nip roller 30, until it contacts the moving glass strip. Another strip of foil 40 may be fed from a roll 42 across a nip roller 43, to contact the moving strip of glass. Then, the strip of glass and the strips of foil are passed between rollers 32 and 34 where they are subjected to a bonding pressure of about 50 to about 350 grams per square inch and preferably about 100 to about 200 grams per square inch to maintain contact between the glass and the foil. The reaction between the glass and foil results in a chemically bond resulting in a laminate 10.

Although FIG. 3 is illustrated with two sheets of foil being placed on either side of the glass strip, it is also within the terms of the present invention to only bond a single strip of foil against one surface of the glass. Further, it is within the terms of the present invention to only form a sheet of glass using a process of the type illustrated in FIG. 3 without the foil laminated thereto. The result is a preform of glass which can be bonded to a strip of copper foil as described herein.

The process of bonding a preform of glass to a copper foil as shown in FIG. 3 preferably occurs in an atmosphere of inert or reducing gas such as, for example, nitrogen, nitrogen 4% hydrogen or argon. The use of deoxidized or oxygen-free copper foil prevents blistering in the foil or at the glass to foil interface when it is bonded under the reducing or inert conditions.

The conductive circuitry may be formed in the foil by a conventional photo-etching step. For example, the outer surface 44 of the glass foil laminate 10 is first coated with a positive photo-resist which may consist of a light sensitive resin of the photodegradable type. Then, a prescribed patterned mask of material, opaque to exposing light, is placed in contact with the photo-resist. On light exposure, only the unmasked portion of the photo-resist layer gets exposed. The mask is then removed and the resist is developed. The exposed protions of the resist are removed and the circuitry etched into the copper in a subsequent etching process. The etching may be accomplished with any conventional solution such as a $FeCl_3$/HCl copper etchant. This solution is typically used in the manufacture of printed circuit boards. The assembly may be coated with photo-resist and etched in this manner several times to produce the desired patterns.

Figure 4:
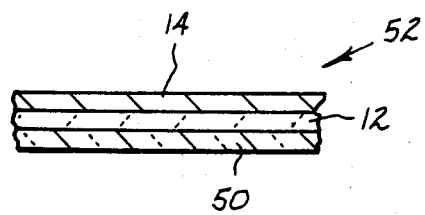
FIG. 4 illustrates a side cross-sectional view of a layer of copper foil glass bonded to a ceramic substrate.

The metal-glass laminates 10 may be bonded to a ceramic substrate 50 to form a composite structure 52 as shown in FIG. 4. The substrate 50 may be formed from an unfired ceramic sheet (green sheet) which may be constituted of materials including silica, silicon carbide, zirconia, zircon, berylia and alumina having a purity of about 90 to about 99%. Preferably, the ceramic material is a commercial 96% alumina which typically includes about 96% $Al_2O_3$ and the remainder including silica, manganese, calcium, and magnesium. These remaining materials are in the glassy phase. It is also within the terms of the present invention to use combinations of the ceramic materials mentioned above or other ceramic materials as desired. The ceramic material is prefired before it is combined with the glass of the present invention.

The process of bonding the substrate 50 to the laminate 52 includes stacking the glass foil laminate against the substrate so that the glass is in contact with the ceramic. Then the assembly is heated to a temperature of about 600° to about 1025° C. so that the glass has a viscosity of about $10^3$ to about $10^8$ poise and preferably between about $10^4$ to about $10^6$ poise. The assembly is then pressed together at a pressure of about 50 to about 350 gr/sq. in. and preferably at about 100 to about 200 gr/sq. in. Finally the assembly is cooled so that the glass stiffens and is chemically bonded to the metal foil and the substrate.

The ceramic substrate may also be bonded to the copper foil with a thin, substantially pore-free glass preform. Although the glass preform may be thin, it is preferably of any appropriate thickness so that full contact may be established between the metal and the ceramic. The preform may be disposed between the foil and the substrate. Then the assembly is heated to a temperature so that the glass has the desired viscosity as described above. Finally, the assembly is put under pressure and cooled so that the glass is chemically bonded to the foil and to the substrate.

More details of this process are described in U.S. patent application Ser. No. 811,905, entitled "Multi-Layer and Hybrid Circuitry".

Figure 5:
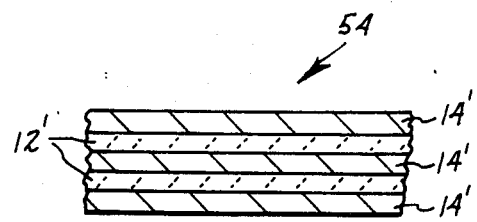
FIG. 5 illustrates a side cross-sectional view of a multi-layer structure in accordance with the present invention.

It is also within the terms of the present invention to stack three or more layers of foil with glass interposed between each layer as illustrated in FIG. 5. Components indicated by primed reference numerals are essentially the same as components with unprimed reference numerals. Each layer of foil 14' may be bonded to an adjacent layer of foil by glass 12' using the techniques described herein.

The multi-layer structure 54 illustrated in FIG. 5 may include through-hole connections and a ceramic substrate if desired as more fully described in U.S. patent application Ser. No. 811,905, entitled "Multi-Layer and Hybrid Circuitry".

Figure 6:
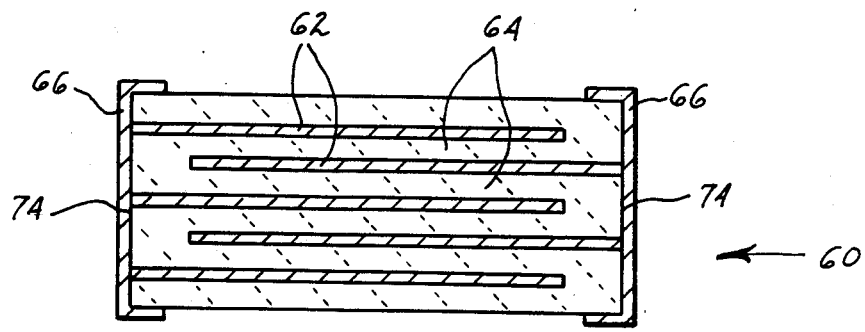
FIG. 6 illustrates a side cross-sectional view of a capacitor incorporating layers of copper alloy foil bonded together by essentially pore-free glass.

Another embodiment of the present invention relates to a laminated glass capacitor 60 and the construction thereof. As shown in FIG. 6, a plurality of internal electrodes 62 are formed in a laminated state with glass layers 64 mutually held between each of two of the internal electrodes to give electrostatic capacity. A pair of external electrodes 66 are connected to the associated ones of the internal electrodes for taking out the electrostatic capacity. The improvement relates to the glass used in the production of the capacitors 60 forming a substantially pore free bond with the internal electrodes. This essentially pore free glass, may be any desired glass having an appropriate coefficient of thermal expansion, such as those previously described in the specification, such as for example those selected from the group consisting of silicate, borosilicate, borate and phosphate glasses. In addition, the internal electrodes are formed of a first metal foil selected from the group consisting of deoxidized copper alloy and oxygen free copper alloy.

To produce a laminated capacitor, the following process may be adopted. Raw dielectric glass, which is essentially the same as glass 12 described earlier in the specification, is melted into a thin ribbon. The glass may be selected from any composition having a viscosity of about $10^3$ to about $10^8$ poise in the temperature range of about 600° C. to about 1025° C. The glass chemically bonds to deoxidized copper alloy and oxygen free copper alloy and is typically selected from the group consisting of silicate, borosilicate, borate and phosphate glasses. However, any desired glass may be incorporated in the present invention. In situations where the lamination process takes place in an inert or reducing atmosphere, the glass composition is preferably selected to be free of lead oxide since lead oxide will partially reduce when heated in a reducing atmosphere. Lead in the glass may develop short circuits between adjacent layers of foil. It is also desirable that the glass be essentially free of bismuth oxide since the latter may also partially reduce and develop short circuits in a manner similar to lead. The coefficient of thermal expansion (CTE) of the glass is not critical since the electrode material is preferably chosen to be a thin, ductile foil of deoxidized copper. The CTE of glasses generally are between about $50 \times 10^{-7}$ to about $160 \times 10^{-7}$ in/in/°C. The glass preferably has a thickness of about 0.1 to about 3 mils.

Figure 7:
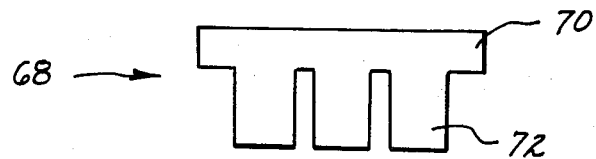
FIG. 7 illustrates a layer of foil suitable to form an internal electrode.

Layers 68 of deoxidized copper alloy or oxygen free copper alloy foil, as shown in FIG. 7, may be shaped by any desired technique such as stamping. Each layer of microthin foil is about 25 to about 100 mils and may be formed with a solid backing 70 and a plurality of projecting elements 72 extending from the backing 70. These layers are stacked so that their solid backings are opposed to other as shown in FIG. 7.

Figure 8:
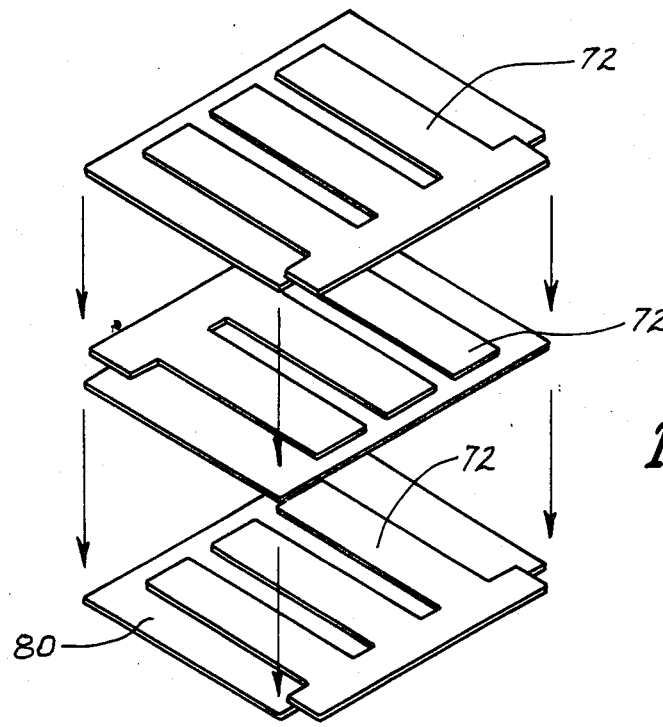
FIG. 8 illustrates an exploded isometric view of the stacked components for forming a capacitor.

During a stacking operation, as illustrated in FIG. 8, a predetermined length of dielectric glass (80) is placed upon a stacking plate (not shown). Then, alternate layers of additional ribbon glass and preformed, foil electrodes are stacked until the final capacitance value is attained. The completed stack is then fired into a monolithic laminated component in a reducing atmosphere as previously described. A layer of glass is preferably provided on the outer sides of the component. The stacked layers are fired to a temperature of about 600° to about 1025° C. where the glass has a viscosity of about $10^3$ to about $10^8$ and preferably between about $10^4$ to about $10^6$ at a temperature between about 800° to about 1000° C. The glass and foil are than pressed together at a pressure of less than about 350 gr/sq. in. and preferably between about 100 to about 200 gr/sq. in. Both the layers of glass and foil are close to their final thicknesses prior to their lamination and therefore relatively low pressure is sufficient to form the laminate having the desired spacing between the foil and the glass. Control of the spacing between the layers of foil is important so that the capcitor has the proper value. The resulting glass-metal laminate is cooled in any conventional manner so that the glass chemically bonds to the foil.

There are two important considerations in the bonding process to prevent blistering of the foil. Firstly, the foil is preferably selected from an oxygen free or a deoxidized copper or copper alloy. Secondly, the bonding preferably occurs under reducing or inert conditions. For example, the copper foil is bonded to the glass in an atmosphere of inert or reducing gas such as for example, nitrogen, nitrogen 4% hydrogen or argon. The use of deoxidized or oxygen free copper foil prevents blistering within the foil when it is bonded under the reducing conditions.

After the glass has solidified, the backing can be trimmed off and the laminate cut between the elements 72 into a plurality of laminated structures. Then, the end surface 74 of the laminate can have the external electrodes applied by any desired process such as conventional gold or copper metallization. It is also within the scope of the present invention to bend one or more of the foil backings, comprising a second metal foil, against the end surfaces. Then pressure is applied and the laminate is then heated in a reducing atmosphere to form the capacitor as shown in FIG. 6.

Although the lamination has been described using alternative layers of glass and metal foil at a thickness close to their desired final thickness, it is also within the terms of the present invention to feed sheets of glass and metal foil to a set of heated rollers within a suitable reducing atmosphere. The desired number of layers could be laminated, have the outer electrode applied and cut to form a capacitor in a series of operations.

The patents, patent applications and publications set forth in this application are intended to be incorporated by reference herein.

It is apparent that there has been provided in accordance with the present invention a laminated glass capacitor and method of making same which fully satisfies the objects, means and advantages set forth herein above. While the invention has been described in combination with the embodiments thereof, it is evident that many alternative, modifications and variations will be apparent to those skilled in the art in light of the foregoing description. Accordingly, it is intended to embrace all such alternatives, modifications and variations as fall within the spirit and broad scope of the appended claims.

We claim:
1. A laminated glass capacitor comprising:
    a plurality of internal electrodes formed in a laminated state with glass layers mutually held between each of two of the internal electrodes to give electrostatic capacity;
    a pair of external electrodes connected to the associated ones of said internal electrodes for taking out the electrostatic capacity,
    the improvement comprising;
    said glass layers being selected from a substantially pore free glass having a viscosity of between about $10^3$ to about $10^8$ at a temperature from about 600° C. to about 1025° C.; and
    said internal electrodes being of a first metal foil selected from the group consisting of deoxidized copper alloy and oxygen free copper alloy.

2. The laminated glass capacitor of claim 1 further comprising said glass being selected from a substantially pore free glass having a consistency of about $10^4$ to about $10^6$ poise in the temperature range of about 800° to about 1000°C.

3. The laminated glass capacitor of claim 2 further comprising said glass having a coefficient of thermal expansion between about $50 \times 10^{-7}$ to about $160 \times 10^{-7}$ in/in/°C.

4. The laminated glass capacitor of claim 3 further comprising said glass having a coefficient of thermal expansion between about $140 \times 10^{-7}$ to about $160 \times 10^{-7}$ in/in/°C.

5. The laminated glass capacitor of claim 4 wherein said external electrodes are of a second metal foil selected from the group consisting of deoxidized copper alloy and oxygen free copper alloy.

6. The laminated glass capacitor of claim 5 wherein said external electrodes are selected from the group of copper, copper alloy, gold, gold alloy and mixtures thereof.

7. The laminated glass capacitor of claim 6 further comprising said glass being selected from the group consisting of silicate, borosilicate, borate and phosphate glasses.

8. The process of producing a laminated glass capacitor comprising, comprising the steps of:
   providing a glass;
   providing a plurality of internal electrodes;
   stacking and bonding said internal electrodes with layers of said glass between each of two of the internal electrodes to give electrostatic capacity;
   providing a pair of external electrodes connected to the associated ones of said internal electrodes for taking out the electrostatic capacity;
   the improvement comprising the steps of;
   selecting said internal electrodes from the group consisting of deoxidized copper alloy and oxygen free copper alloy; and
   forming said glass layers from a substantially pore free glass having a viscosity of between about $10^3$ to about $10^8$ at a temperature from about 600° C. to about 1025° C.

9. The process of claim 8 further comprising the step of selecting said glass from a substantially pore free glass having a consistency of about $10^4$ to about $10^6$ poise in the temperature range of about 800° to about 1000° C.

10. The process of claim 9 further comprising the step of selecting said glass having a coefficient of thermal expansion between about $50 \times 10^{-7}$ to about $160 \times 10^{-7}$ in/in/°C.

11. The process of claim 10 further comprising the step of selecting said glass having a coefficient of thermal expansion between about $140 \times 10^{-7}$ to about $160 \times 10^{-7}$ in/in/°C.

12. The process of claim 11 further comprising the step of forming said external electrodes from the group consisting of deoxidized copper alloy and oxygen free copper alloy.

13. The process of claim 12 further comprising the step of forming said external electrodes from the group consisting of copper, copper alloy, gold, gold alloy and mixtures thereof.

14. The process of claim 13 further comprising the step of selecting said glass from the group consisting of silicate, borosilicate, borate and phosphate glasses.

15. The article produced by the process of claim 8.

16. The article produced by the process of claim 10.

* * * * *